(12) United States Patent
Chevrier et al.

(10) Patent No.: US 9,853,638 B2
(45) Date of Patent: Dec. 26, 2017

(54) TOUCH ON GLASS

(71) Applicant: Texas Instruments Deutschland GmbH, Freising (DE)

(72) Inventors: Matthieu Etienne Marius Chevrier, Freising (DE); Andreas Felix Martin Kraemer, Eichenau (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 69 days.

(21) Appl. No.: 14/839,308

(22) Filed: Aug. 28, 2015

(65) Prior Publication Data

US 2017/0060291 A1     Mar. 2, 2017

(51) Int. Cl.
   *G06F 3/044*       (2006.01)
   *H03K 17/96*      (2006.01)
   *H03K 17/95*      (2006.01)

(52) U.S. Cl.
   CPC ......... *H03K 17/96* (2013.01); *H03K 17/9505* (2013.01); *H03K 17/9537* (2013.01); *H03K 2217/96019* (2013.01); *H03K 2217/96023* (2013.01); *H03K 2217/96038* (2013.01)

(58) Field of Classification Search
None
See application file for complete search history.

(56) References Cited

U.S. PATENT DOCUMENTS

| | | | | |
|---|---|---|---|---|
| 6,639,585 B1* | 10/2003 | Nagai | ..................... | G06F 3/046 345/173 |
| 2013/0187742 A1* | 7/2013 | Porter | ................... | G06F 3/0202 336/200 |
| 2014/0028587 A1* | 1/2014 | Sugiyama | ............... | G06F 3/041 345/173 |
| 2014/0225844 A1* | 8/2014 | Tada | ....................... | G06F 3/044 345/173 |
| 2015/0109157 A1* | 4/2015 | Caldwell | ............... | H03M 3/458 341/143 |
| 2016/0069662 A1* | 3/2016 | Mullenix | ................. | G01D 5/22 324/207.15 |

* cited by examiner

*Primary Examiner* — Carolyn R Edwards
*Assistant Examiner* — Krishna Neupane
(74) *Attorney, Agent, or Firm* — Kenneth Liu; Charles A. Brill; Frank D. Cimino

(57) ABSTRACT

A touch-sensitive glass barrier has a conductive coil affixed to the first side of a glass barrier, a capacitor connected to the conductive coil to form a resonator, and an inductance-to-digital converter (LDC) connected to drive an alternating current through the resonator. The LDC determines whether a conductive target has touched the second side of the glass barrier at a point opposite the conductive coil; and responsive to determining that the conductive target has touched the second side of the glass barrier at the point, provides a signal.

20 Claims, 2 Drawing Sheets

TOUCH ON GLASS

FIELD OF THE DISCLOSURE

Disclosed embodiments relate generally to the field of touch-sensitive glass. More particularly, and not by way of any limitation, the present disclosure is directed to providing touch-sensitive glass for applications in which controls for a human-machine interface are isolated using a thick sight glass.

BACKGROUND

In some industrial settings, it is necessary to provide a sealed environment around electronic equipment in order, for example, to prevent an explosion that could be triggered by the electronics. In such an environment, outputs may be viewed and controls accessed through a sight glass, which is typically a thick glass disk, e.g., 8 mm, held between two metal frames. The metal frames are generally secured by bolts and gaskets, although alternatively, the glass disc can be fused to the metal frame during manufacture. To access the controls, the sight glass is openable, generally with protocols indicating the conditions under which the sight glass can be opened to access underlying controls. A means of providing input to the electronics underlying the sight glass without opening the sight glass is desirable. Capacitive touch detectors are successfully used in many consumer products, e.g., indium tin oxide (ITO)-based solutions for touch screens on computers and cell phones, but will not work in these industrial settings, given the thickness of the glass.

SUMMARY

A touch sensitive glass that can detect human input such as a finger through a thick sight glass is disclosed using an inductive sensor. Also disclosed is a method of using the touch sensitive glass. An example inductive sensor includes a conductive coil printed on a Printed Circuit Board (PCB) and coupled to a capacitor to form an LC tank resonator; with an Inductance-to-Digital converter (LDC) attached to drive an alternating current to the resonator. The resonator is affixed to the inner surface of the sight glass; when a conductive target such as a human finger is placed on the sight glass opposite the conductive coil, the LDC is able to detect the presence of the conductive target and to provide a signal to an appropriate input node of the electronic equipment, thereby removing the need to open the sight glass to manipulate controls.

In one aspect, an embodiment of a touch-sensitive glass barrier is disclosed. The touch-sensitive glass barrier comprises a glass barrier having a first side and a second side that is opposite the first side; a conductive coil affixed to the first side of the glass barrier; a capacitor connected to the conductive coil to form a resonator; and an inductance-to-digital converter (LDC) connected to drive an alternating current through the resonator, the LDC being configured to determine whether a conductive target has touched the second side of the glass barrier at a point opposite the conductive coil and responsive to determining that the conductive target has touched the second side of the glass barrier at the point, to provide a signal.

In another aspect, an embodiment of a human-machine interface (HMI) is disclosed. The HMI comprises an input node for electronics; a sight glass that forms part of a protective environment for the input node, the sight glass having a first side that faces the electronics and a second side that is opposite the first side; a conductive coil, the conductive coil being affixed to the first side of the glass shield; a capacitor connected to the conductive coil to form a resonator; and an inductance-to-digital converter (LDC) attached to drive an alternating current through the resonator, the LDC configured to detect a touch on the second side of the sight glass at a point opposite the conductive coil and to provide a signal to the input node responsive to the touch.

In another aspect, an embodiment of a method of detecting a touch input to equipment through a sight glass having a first side that faces the equipment and a second side opposite the first side is disclosed. The method comprises affixing a conductive coil to a first side of the sight glass; connecting a capacitor to the conductive coil to form a resonator; connecting an Inductance-to-Digital Converter (LDC) to the resonator, the LDC providing an alternating current to the resonator; determining whether a conductive target has touched the second side of the sight glass at a point opposite the conductive coil; and responsive to detecting that the conductive target has touched the second side of the sight glass at the point, sending a signal to an input node of the equipment.

Advantages of the disclosed device and method include the ability to provide input to the electronic equipment without needing to open the sight glass, removing this opportunity for adverse effects from exposure of the environment to the electronic equipment.

BRIEF DESCRIPTION OF THE DRAWINGS

Embodiments of the present disclosure are illustrated by way of example, and not by way of limitation, in the Figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing Figures in which:

DETAILED DESCRIPTION OF THE DRAWINGS

Specific embodiments of the invention will now be described in detail with reference to the accompanying Figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 1:
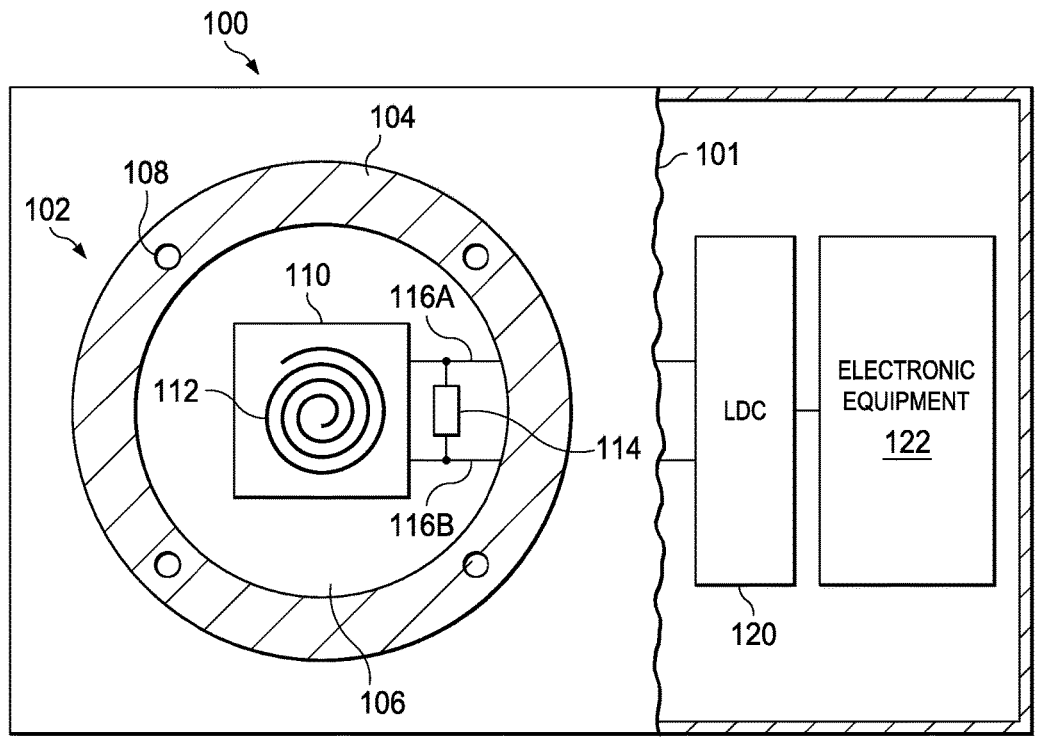
FIG. 1 depicts an example of a human-machine interface (HMI) that can be used to practice an embodiment of the disclosure.

Referring now to the drawings and more particularly to FIG. 1, an example is shown of a human-machine interface 100 that utilizes a sight glass for access to the controls of electronic equipment that need to be isolated from the general environment. Barrier 101 separates underlying electronic equipment 122, shown in a cutaway section of barrier 101, from the external environment (not specifically shown). In order to provide access to the controls of electronic equipment 122, sight glass 102 is provided. Sight glass 102 includes metal frame 104 and glass disc 106. In the embodiment shown, bolts 108 secure glass disc 106 between metal frame 104 and a second metal frame (not specifically shown). As previously noted, glass disc can alternatively be bonded to the frame. In the prior art, sight glass 102 would be openable, in order to allow access to switches that control electronic equipment 122. Such openable sight glasses can also be utilized in practicing the present disclosure. In at least one embodiment of the disclosure, sight glass 102 is not openable, since input to the controls can be provided through glass disc 106.

Returning to the figure, PCB 110, which contains conductive coil 112, is visible behind glass disc 106. In the embodiment shown, conductive coil 112 is formed in the shape of a circular spiral, although in at least one embodiment, conductive coil 112 is another shape. A conductive coil having a diameter 'd' can effectively sense a human finger up to a distance of approximately d/2. In at least one embodiment, conductive coil 112 has a diameter that is selected to be 16 mm or larger. Conductive coil 112 is connected to LDC 120 through conductive elements 116A, 116B, which can be wires or other conductive materials capable of providing an electrical connection. In at least one embodiment, conductive elements 116A, 116B can be several tens of centimeters long, so that conductive coil 112 and LDC chip 120 do not have to be placed immediately adjacent each other. Capacitor 114 is connected to conductive elements 116A, 116B and together with conductive coil 112 forms an LC resonator connected to LDC 120. LDC 120 is also connected to the electronic equipment 122 in order to provide a signal to electronic equipment 122 when the glass opposite to conductive coil is touched with a conductive element. Applicant has demonstrated that in the arrangement of FIG. 1, a human finger touched to sight glass 106 opposite the location of conductive coil 112 can be detected by LDC 120, which can provide an appropriate signal to electronic equipment 122. Not only can a human finger provide the desired results, but Applicant has further demonstrated that detection of a finger can occur even through thick gloves, such as those worn by firefighters. This provides an advantage in touch-sensitive glass that capacitive touch input systems cannot match.

It will be recognized that conductive coil 112 can alternatively take other forms from that shown in FIG. 1, such as a square spiral or any other shape that can be used to detect the presence of a target on the opposite side of the sight glass. In the embodiment illustrated, copper is used to form conductive coil 112 on PCB 110, although other conductive materials can also be used. In at least one embodiment, conductive coil 112 is formed on a material other than PCB, e.g. a polyimide film. PCB 110 (or other material) with conductive coil 112 can be glued or otherwise affixed to the inside of sight glass 102. In at least one embodiment, conductive coil 112 is not created on PCB 110 or another material, but is deposited directly on one side of glass disk 106. In this embodiment, conductive coil 112 can be formed, e.g., of silver or ITO. LDC 120 drives an NC current through the resonator formed by conductive coil 112 and capacitor 114; the NC current causes a magnetic field around conductive coil 112. A finger or other conductive target that touches glass disc 106 at a point opposite to conductive coil 112 causes the resistance and permittivity of the resonator to change. LDC Converter 120 detects the change and can provide a signal to electronic equipment 122.

Figure 2:
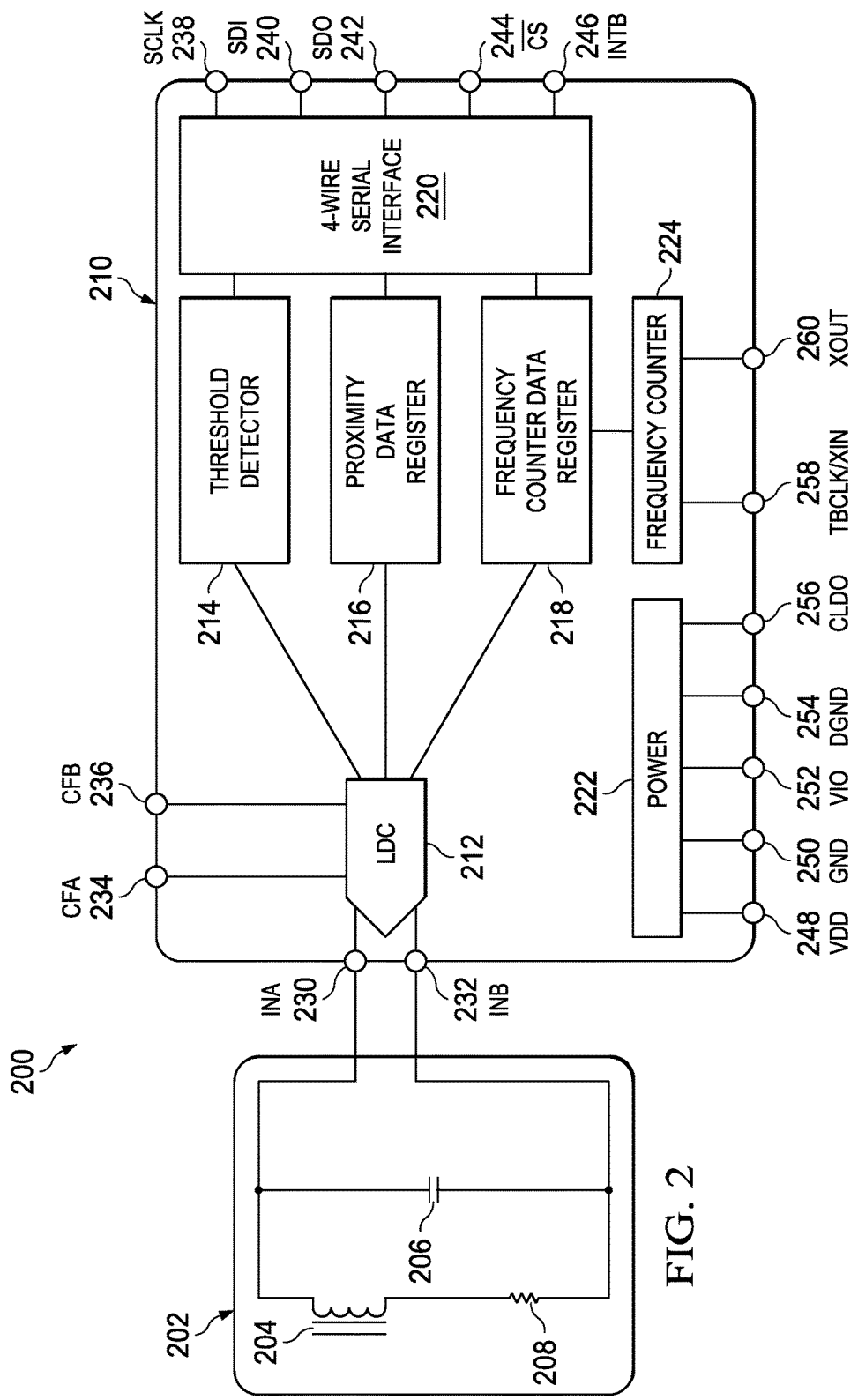
FIG. 2 depicts a functional block diagram of the inductive sensor formed by a conductive coil, a capacitor and an LDC 120 according to an embodiment of the disclosure.

FIG. 2 depicts a functional block diagram of inductive sensor 200, which is formed of a resonator 202 and LDC chip 210 according to an embodiment of the disclosure. Resonator 202 includes an inductor, i.e., conductive coil 204, and capacitor 206, which are connected in parallel; resistor 208 reflects the conductive coil's parasitic series resistance. In at least one embodiment, conductive coil 204 is a copper coil formed on PCB. In at least one embodiment, LDC chip 210 is the LDC1000 chip manufactured by Texas Instruments Incorporated, although it will be understood that other LDC chips can also be utilized. Within LDC chip 210, LDC module 212 is connected to the two terminals of resonator 202 through contacts INA 230 and INB 232 and measures the parallel impedance, Rp, of resonator 202. This is accomplished by regulating the oscillation amplitude in the closed-loop configuration to a constant level while monitoring the energy dissipated by resonator 202. By monitoring the amount of power injected into resonator 202, LDC module 212 determines the value of Rp and returns a digital value which is inversely proportional to Rp.

Within LDC chip 210, threshold detector module 214 provides a comparator with hysteresis. When the threshold registers (not specifically shown) are programmed and the comparator (also not specifically shown) is enabled, proximity data register 216 is compared with the threshold registers and INTB terminal 246 indicates the output. LDC chip 210 has a simple 4-wire serial interface 220. The INTB terminal 246 can further provide other functions, which are programmable with a Serial Peripheral Interface (SPI). In at least one embodiment, separate power supplies are provided for analog power (VDD 248 and GND 250) and digital power (VIO 252 and DGND 254). In at least one embodiment, analog power operates at 5 V and digital at 1.8-5 V.

In at least one embodiment, LDC chip 210 uses frequency counter 224 to measure the sensor's frequency of oscillation; the timing for frequency counter 224 is set by an external clock applied on TBCLK/XIN terminal 258. Alternatively, a crystal can be connected between XIN and XOUT with a capacitor connected from each of these pins-to-ground. When an external clock is utilized, XOUT can be floating. In at least one embodiment, an integrated low dropout (LDO) regulator (not specifically shown) uses a capacitor connected from CLDO 256 terminal to GND 250. In at least one embodiment, additional pins on LDC chip 210 include CFA 234 and CFB 236, which utilize a filter capacitor connected between the two pins, SCLK 238, which provides a clock that is used to clock data from or into the chip, CSBar 244, which can be used to select the device to be communicated with when multiple devices are connected on the same SPI bus, SDI 240, which receives SPI Slave Data In, and SDO 242, which sends SPI Slave Data Out.

When an NC current flows through conductive coil 204, an alternating magnetic field is generated. If a conductive target, such as a finger, is brought into the vicinity of the coil, this magnetic field will induce circulating currents (eddy currents) on the surface of the target. These eddy currents are a function of the distance, size, and composition of the target. The eddy currents then generate their own magnetic field, which opposes the original field generated by the coil. This mechanism is comparable to that in a transformer, with conductive coil 204 acting as the primary core and the eddy current being generated in the secondary core, (e.g., the finger). The inductive coupling between conductive coil 204 and a finger depends on the distance between the two objects and their shape. Hence the resistance and inductance of the secondary core (finger), shows up as a distant dependent resistive and inductive component on the primary side (conductive coil).

It is know that generating an alternating magnetic field with just an inductor, such as conductive coil 204 consumes a large amount of power; power consumption is reduced by adding a parallel capacitor, e.g., capacitor 206, turning the combination into a resonator. In this manner the power consumption is reduced to the eddy current losses R(d) and inductor losses Rs only. In at least one embodiment, LDC chip 210 doesn't measure the series resistance directly; instead it measures the equivalent parallel resonance impedance Rp, which is distance dependent. Parallel resonance impedance Rp(d) is given by:

$$Rp(d) = \frac{(Ls + L(d))}{(Rs + R(d)) \times C}$$

Where
  Ls is the coil's inductance,
  Rs is the coil's parasitic series,
  L(d) is the coupled inductance of the target finger and is a function of the distance d,
  R(d) is the parasitic resistance of the eddy currents and is also a function of distance, and
  C is the capacitance of capacitor 206.

Figure 3:
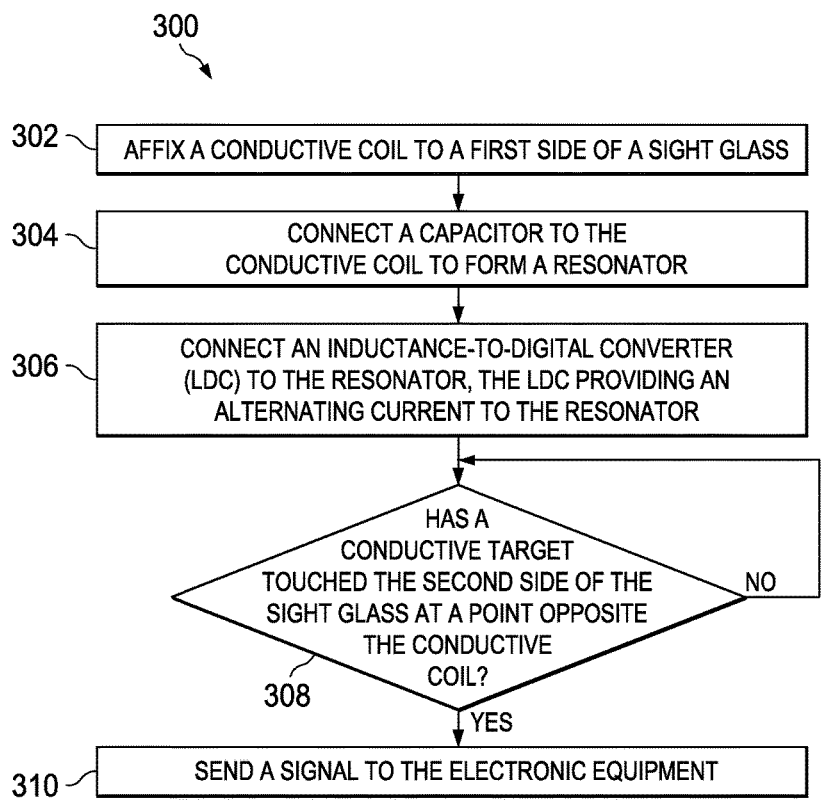
FIG. 3 is a flowchart of a method for detecting a touch input to a machine through a sight glass.

Turning next to FIG. 3, a flowchart of a method of detecting a touch input to a machine through a sight glass is disclosed. The method begins by affixing (302) a conductive coil to the first side of a sight glass. As noted previously, the conductive coil can be formed on a material such as PCB, which can then be glued or otherwise attached to the inside of the sight glass, or can be formed directly on the inside surface of sight glass. A capacitor is connected (304) to the conductive coil to form a resonator and an LDC is connected (306) to the resonator. The LDC provides an alternating current to the resonator in order to generate the magnetic field for sensing. During use of the equipment, a conductive target, such as a human finger, touches (308) the outside surface of the sight glass at a point opposite the conductive coil. Such a touch will cause changes in the magnetic field of the resonator and the method detects (310) the change in inductance and serial resistance in the resonator. In at least one embodiment, a high-level algorithm detects, from changes in Rs and L, whether a finger touch has occurred. When a finger touch has occurred, the method sends (312) a signal to the electronic equipment. This signal can be used to provide the input which previously required opening of the sight glass and the physical pushing of switches or buttons to provide the necessary inputs.

Turning now to FIG. 3, a method 300 for detecting a touch input to a machine through a sight glass is shown. The method begins by affixing (302) a conductive coil to a first side of a sight glass, i.e., on the side nearest the electronic components. In at least one embodiment, the conductive coil and backing material are glued to the sight glass. In at least one embodiment, the conductive coil is formed on the glass itself. The method proceeds with connecting (304) a capacitor to the conductive coil to form a resonator. An LDC is then connected (306) to the resonator so formed, with the LDC providing an alternating current to the resonator. The LDC determines (308) whether a conductive target, e.g., a finger, has touched the sight glass at a point opposite the conductive coil. The LDC does this, e.g., by detecting a change in inductance and serial resistance in the resonator that can be interpreted as an appropriate touch. If no touch has been received, the LDC continues to wait; if the LDC determines that a touch from a conductive target has occurred, the LDC sends (310) an appropriate signal to the electronic equipment.

Although various embodiments have been shown and described in detail, the claims are not limited to any particular embodiment or example. Moreover, none of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A touch-sensitive glass barrier, comprising:
  a glass barrier having a first side and a second side that is opposite the first side;
  a conductive coil affixed to the first side of the glass barrier;
  a capacitor connected to the conductive coil in parallel to form a resonator; and
  an inductance-to-digital converter (LDC) connected to drive an alternating current through the resonator, the LDC being configured to determine whether a conductive target has touched the second side of the glass barrier at a point opposite the conductive coil and responsive to determining that the conductive target has touched the second side of the glass barrier at the point, to provide a signal.

2. The touch-sensitive glass barrier as recited in claim 1 wherein the conductive coil forms a circular spiral.

3. The touch-sensitive glass barrier as recited in claim 2 wherein the conductive coil comprises copper formed on a printed circuit board (PCB), the PCB being attached to the first side of the sight glass.

4. The touch-sensitive glass barrier as recited in claim 2 wherein the conductive coil comprises a silver coating applied to the first side of the glass barrier.

5. The touch-sensitive glass barrier as recited in claim 2 wherein the conductive coil comprises an indium tin oxide coating applied to the first side of the glass barrier.

6. The touch-sensitive glass barrier as recited in claim 1 wherein the touch is made by a human finger.

7. The touch-sensitive glass barrier as recited in claim 1 wherein the glass barrier is 8 mm thick.

8. A human-machine interface (HMI), comprising:
  an input node for electronics;

a sight glass that forms part of a protective environment for the input node, the sight glass having a first side that faces the electronics and a second side that is opposite the first side;

a conductive coil, the conductive coil being affixed to the first side of the glass shield;

a capacitor connected to the conductive coil to form a resonator; and an inductance-to-digital converter (LDC) having first and second contacts connecting the LDC to first and second terminals, respectively, of the resonator in parallel, the LDC being configured to drive an alternating current through the resonator, to detect a touch on the second side of the sight glass at a point opposite the conductive coil, and to provide a signal to the input node responsive to the touch.

9. The HMI as recited in claim 8 wherein the conductive coil forms a circular spiral.

10. The HMI as recited in claim 9 wherein the conductive coil comprises copper formed on a printed circuit board (PCB), the PCB being attached to the first side of the sight glass.

11. The HMI as recited in claim 9 wherein the conductive coil comprises a silver coating applied to the first side of the sight glass.

12. The HMI as recited in claim 9 wherein the conductive coil comprises an indium tin oxide coating applied to the first side of the sight glass.

13. The HMI as recited in claim 8 wherein the touch is made by a human finger.

14. A method of detecting a touch input to equipment through a sight glass having a first side that faces the equipment and a second side opposite the first side, the method comprising:

affixing a conductive coil to the first side of the sight glass;

connecting a capacitor to the conductive coil to form a resonator;

connecting an Inductance-to-Digital Converter (LDC) to the resonator, the LDC providing an alternating current to the resonator;

determining whether a conductive target has touched the second side of the sight glass at a point opposite the conductive coil, wherein determining whether the conductive target has touched the second side of the sight glass at the point includes using the LDC to measure a parallel impedance of the resonator; and responsive to determining that the conductive target has touched the second side of the sight glass at the point, sending a signal to an input node of the equipment.

15. The method as recited in claim 14 wherein the touch is received from a human finger.

16. The method as recited in claim 14 wherein affixing the conductive coil to the sight glass comprises gluing a printed circuit board on which the conductive coil is formed to the sight glass.

17. The method as recited in claim 14 affixing the conductive coil to the sight glass comprises applying a silver coating to the first side of the sight glass.

18. The method as recited in claim 14 wherein affixing the conductive coil to the sight glass comprises applying an indium tin oxide coating to the first side of the sight glass.

19. The touch-sensitive glass barrier as recited in claim 1, wherein the LDC includes first and second contacts connected to first and second terminals, respectively, of the resonator in parallel.

20. The HMI as recited in claim 8, wherein the LDC is configured to detect the touch on the second side of the sight glass at the point opposite the conductive coil by measuring a parallel impedance of the resonator.

* * * * *